United States Patent
Bhuyan et al.

(10) Patent No.: US 11,756,785 B2
(45) Date of Patent: Sep. 12, 2023

(54) MOLECULAR LAYER DEPOSITION CONTACT LANDING PROTECTION FOR 3D NAND

(71) Applicant: Applied Materials, Inc., Santa Clara, CA (US)

(72) Inventors: Bhaskar Jyoti Bhuyan, San Jose, CA (US); Zeqing Shen, San Jose, CA (US); Susmit Singha Roy, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/407,553

(22) Filed: Aug. 20, 2021

(65) Prior Publication Data

US 2023/0059788 A1 Feb. 23, 2023

(51) Int. Cl.
*H01L 21/02* (2006.01)
*H01L 21/311* (2006.01)

(52) U.S. Cl.
CPC ... *H01L 21/02115* (2013.01); *H01L 21/31111* (2013.01)

(58) Field of Classification Search
None
See application file for complete search history.

(56) References Cited

U.S. PATENT DOCUMENTS

| | | |
|---|---|---|
| 2013/0270714 A1 | 10/2013 | Lee et al. |
| 2018/0144977 A1* | 5/2018 | Yu ............... H01L 21/76816 |
| 2019/0273089 A1* | 9/2019 | Yamamoto ....... H01L 21/76816 |
| 2020/0168440 A1* | 5/2020 | Kang ............... H01L 21/02274 |
| 2020/0194447 A1* | 6/2020 | Sun ................. H01L 27/11529 |
| 2021/0242131 A1 | 8/2021 | Ong et al. |
| 2021/0287991 A1* | 9/2021 | Sun ................. H01L 21/76805 |
| 2021/0391315 A1* | 12/2021 | Zhang ................. H01L 24/80 |
| 2022/0189974 A1* | 6/2022 | Fang ............... H01L 21/76816 |

FOREIGN PATENT DOCUMENTS

| | | |
|---|---|---|
| CN | 105355587 A | 2/2016 |
| KR | 20130007200 A | 1/2013 |
| KR | 20160109986 A | 9/2016 |

OTHER PUBLICATIONS

International Search Report and Written Opinion dated Dec. 1, 2022 in International Patent Application No. PCT/US2022/040721, 10 pages.

* cited by examiner

*Primary Examiner* — Shamim Ahmed
(74) *Attorney, Agent, or Firm* — Kilpatrick Townsend & Stockton LLP (57) ABSTRACT

Exemplary methods of semiconductor processing may include etching one or more features partially through a dielectric material to expose material from one or more layer pairs formed on a substrate. The methods may include halting the etching prior to penetrating fully through the dielectric material, and prior to exposing material from all layer pairs formed on the substrate. The methods may include forming a layer of carbon-containing material on the exposed material from each of the one or more layer pairs having exposed material. The methods may include etching the one or more features fully through the dielectric material to expose material for each remaining layer pair formed on the substrate.

20 Claims, 5 Drawing Sheets

MOLECULAR LAYER DEPOSITION CONTACT LANDING PROTECTION FOR 3D NAND

TECHNICAL FIELD

The present technology relates to semiconductor processes and materials. More specifically, the present technology relates to forming protective layers during processing to access layers of material on a substrate.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric materials through which a number of memory holes or apertures may be etched, and to which contact access may be formed to each pair of layers. Material properties of the layers of materials, as well as process conditions and materials for etching, may affect the uniformity of the formed structures. Exposure of overlying materials to continued etchants may cause damage to top layers while access is still being formed for underlying layers.

Thus, there is a need for improved systems and methods that can be used to produce high quality devices and structures. These and other needs are addressed by the present technology.

SUMMARY

Exemplary methods of semiconductor processing may include etching one or more features partially through a dielectric material to expose material from one or more layer pairs formed on a substrate. The methods may include halting the etching prior to penetrating fully through the dielectric material, and prior to exposing material from all layer pairs formed on the substrate. The methods may include forming a layer of carbon-containing material on the exposed material from each of the one or more layer pairs having exposed material. The methods may include etching the one or more features fully through the dielectric material to expose material for each remaining layer pair formed on the substrate.

In some embodiments, forming the layer of carbon-containing material includes one or more cycles of providing a first molecular species that selectively couples with the exposed material formed on the substrate relative to the dielectric material, and providing a second molecular species that selectively couples with the first molecular species. The first molecular species may be characterized by a head group including an amine, diamine, diol, or dithiol. The second molecular species may include oxygen. Forming the layer of carbon-containing material may include providing a metal-containing precursor to couple with either of the first molecular species or the second molecular species. Forming the layer of carbon-containing material may include alternating delivery of an oxygen-containing material with either of the first molecular species or the second molecular species. Forming the layer of carbon-containing material may include one or more additional cycles of providing the first molecular species, and providing the second molecular species. The layer of carbon-containing material may be formed to a thickness of greater than or about 5 nm. Forming the layer of carbon-containing material may be performed at a substrate temperature of less than or about 200° C. The layer pairs may include alternating layers of oxide and silicon nitride, and the silicon nitride may overlie the oxide in each layer pair. The methods may include removing the layer of carbon-containing material from the exposed material from each of the one or more layer pairs having exposed material formed on the substrate. The removing may include oxidizing the layer of carbon-containing material or performing a thermal anneal.

Some embodiments of the present technology may encompass semiconductor processing methods. The methods may include etching one or more features partially through a dielectric material to expose silicon nitride from a first set of layer pairs formed on a substrate. The methods may include halting the etching prior to penetrating fully through the dielectric material, and prior to exposing a second set of layer pairs formed on the substrate under the first set of layer pairs. The methods may include forming a layer of carbon-containing material on each region of silicon nitride exposed on the first set of layer pairs. The methods may include etching the one or more features fully through the dielectric material to expose silicon nitride from the second set of layer pairs on the substrate.

In some embodiments, forming the layer of carbon-containing material may include one or more cycles of providing a first molecular species that selectively couples with the silicon nitride from the first set of layer pairs, and providing a second molecular species that selectively couples with the first molecular species. The first molecular species may include an amine head group. Forming the layer of carbon-containing material may be performed at a substrate temperature of less than or about 200° C. The layer of carbon-containing material may be formed to a thickness of greater than or about 10 nm. The first set of layer pairs and the second set of layer pairs may include alternating layers of oxide and silicon nitride. The silicon nitride may overlie the oxide in each layer pair. The methods may include removing the layer of carbon-containing material from the region of silicon nitride exposed on the first set of layer pairs formed on the substrate.

Some embodiments of the present technology may encompass semiconductor processing methods. The methods may include etching one or more features partially through a dielectric material to expose silicon nitride from a first set of layer pairs formed on a substrate. The layer pairs may be formed in a staircase structure, and each feature of the one or more features may be aligned with a separate layer pair. The methods may include halting the etching prior to penetrating fully through the dielectric material, and prior to exposing a second set of layer pairs formed on the substrate under the first set of layer pairs. The methods may include forming a layer of carbon-containing material on each region of silicon nitride exposed on the first set of layer pairs. The methods may include etching the one or more features fully through the dielectric material to expose silicon nitride from the second set of layer pairs formed on the substrate. In some embodiments, forming the layer of carbon-containing material may include one or more cycles of providing a first molecular species that selectively couples with the silicon nitride from the first set of layer pairs, and providing a second molecular species that selectively couples with the first molecular species.

Such technology may provide numerous benefits over conventional systems and techniques. For example, the processes and structures may protect against damage to top layers during etching operations to access underlying layers. Additionally, the operations of embodiments of the present technology may improve contact access formation to each layer pair of materials through the dielectric material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of memory holes and contact apertures increase, sometimes dramatically. During 3D NAND processing, stacks of placeholder layers and dielectric materials may initially be formed, and within which the memory cells may be formed. These placeholder layers may have a variety of operations performed to place structures before fully removing the material and replacing it with metal. The layers are often formed overlying a conductor layer, such as polysilicon, for example. When the memory holes are formed, apertures may extend through all of the alternating layers of material before accessing the polysilicon or other material substrate. Subsequent processing may form a staircase structure for contacts, and may also exhume the placeholder materials laterally. The staircase may be filled with a dielectric material, and contact apertures may be produced to access each layer pair.

A reactive-ion etching ("RIE") operation may be performed to produce the high aspect ratio memory holes and contact apertures. The RIE process often involves a combination chemical and physical removal of the alternating layers, which may form a carbon polymer layer over sidewalls during etching, and which may be intended to protect layers from further etching. As one non-limiting example, where the alternating layers may include silicon oxide and silicon nitride, the silicon oxide may be removed to a greater degree by physical bombardment of the layer during the RIE, and the silicon nitride may be removed to a greater degree by chemical reaction of the RIE precursors with the nitride materials.

Conventional technologies may struggle with uniformity and control during the contact access formation because the process to etch through the dielectric material may still expose accessed layers to reactant species, which over time may damage or etch through overlying structures while underlying layers are still being accessed. Conventional technologies have been limited in the number of layers of material that can be patterned due to the exposure of top layers of material, which due to the length of time of exposure may still be etched even with relatively high selectivity between the materials.

The present technology overcomes these issues by performing molecular layer deposition on exposed layers of the staircase to protect the materials from excess etching. Unlike conventional technologies, the present technology may allow layers at the top of the structure to be fully protected while underlying layers are being accessed. The process may then separate the etching operation into two parts, where a protective layer may be deposited over initially etched material to limit over-etching as a second etch operation is performed to fully penetrate the dielectric material. Because the present technology may selectively deposit the protective material, only the exposed staircase materials may develop the protective material, while partially etched features through the dielectric may be maintained for the second portion of the etching.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

Figure 1:
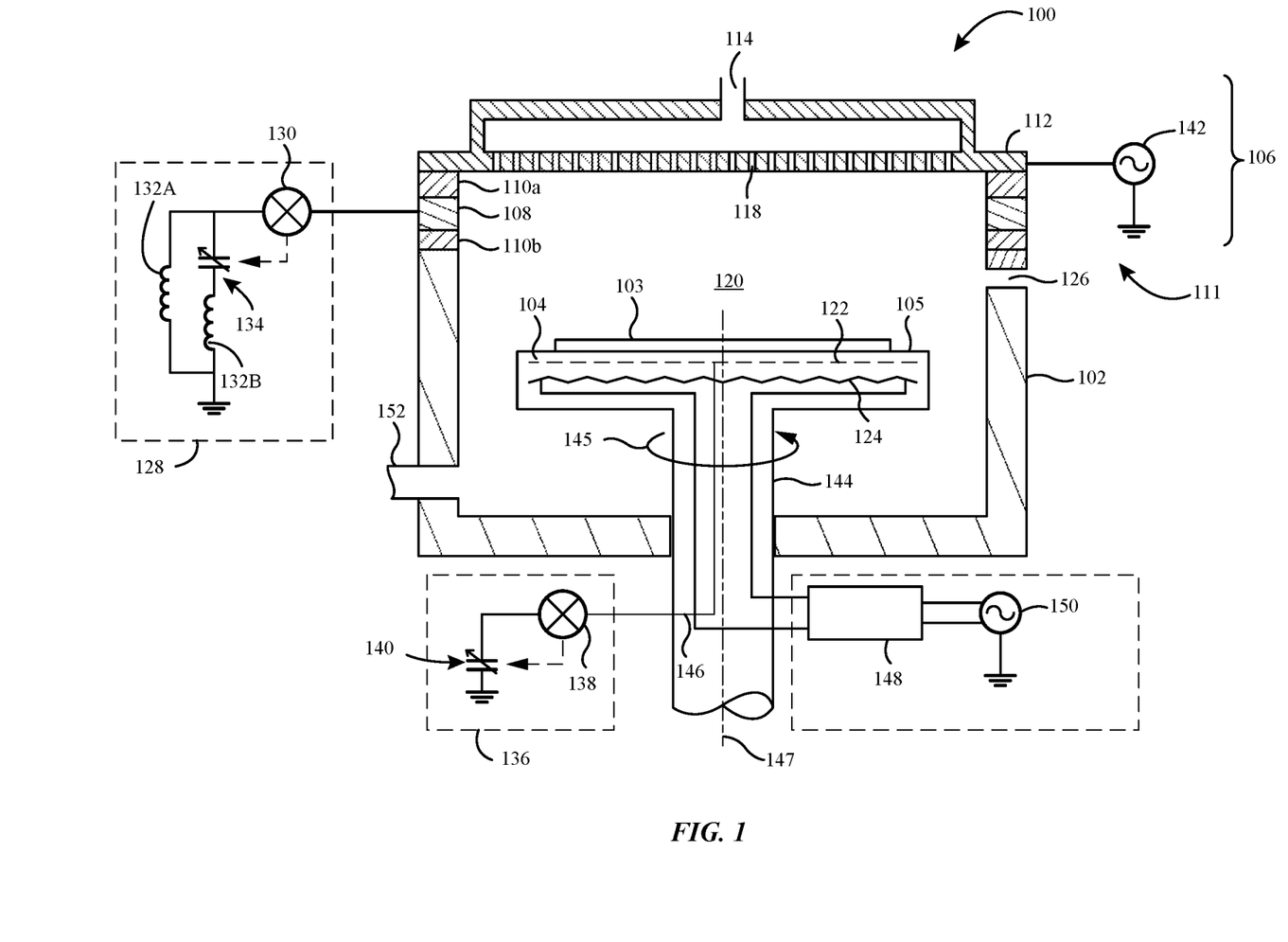
FIG. 1 shows a schematic cross-sectional view of an exemplary processing chamber according to some embodiments of the present technology.

FIG. 1 shows a cross-sectional view of an exemplary processing chamber system 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located.

Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
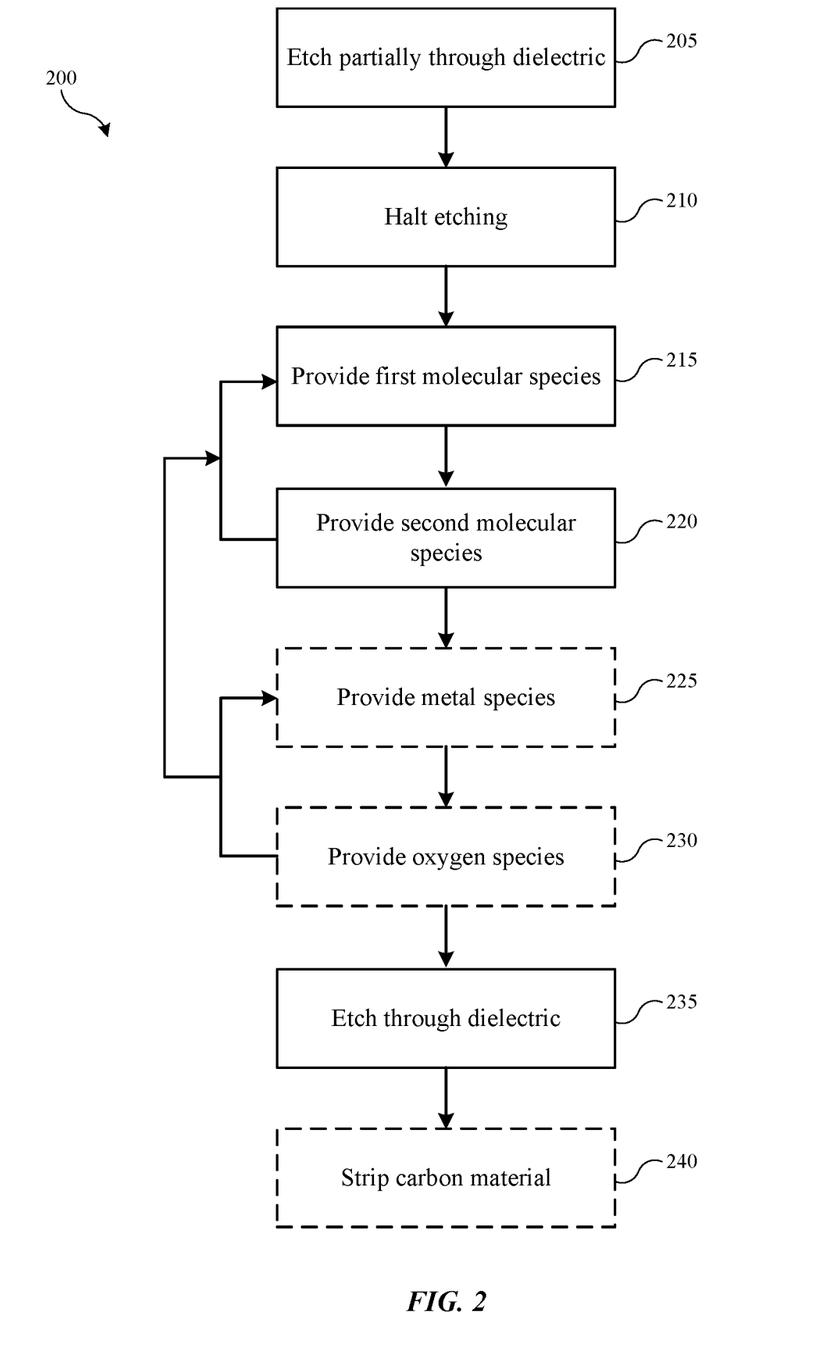
FIG. 2 shows selected operations in a formation method according to some embodiments of the present technology.

As noted above, the present technology may form a protective barrier on exposed regions of layer pairs, which may protect overlying layers while etching proceeds to provide access to lower layers at the substrate level. Turning to FIG. 2 is shown exemplary operations in a method 200 for forming a semiconductor structure according to embodiments of the present technology. Method 200 may include one or more operations prior to the initiation of the method, including front-end processing, deposition, etching, polishing, cleaning, or any other operations that may be performed prior to the described operations. For example, the method may begin after a number of pairs of layers have been deposited for producing 3D NAND memory and a staircase contact structure has been formed. However, as explained above, it is to be understood that the figures illustrate just one exemplary process in which molecular layer deposition according to embodiments of the present technology may be employed, and the description is not intended to limit the technology to this process alone. Some or all of the operations may be performed in chambers or system tools as previously described, or may be performed in different chambers on the same system tool, which may include the chamber in which the operations of method 200 may be performed.

Method 200 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 200 describes operations shown schematically in FIGS. 3A-3F, the illustrations of which will be described in conjunction with the operations of method 200. It is to be understood that FIG. 3 illustrates only partial schematic views, and a substrate may contain any number of structural sections having aspects as illustrated in the figures, as well as alternative structural aspects that may still benefit from operations of the present technology.

Figure 3A:
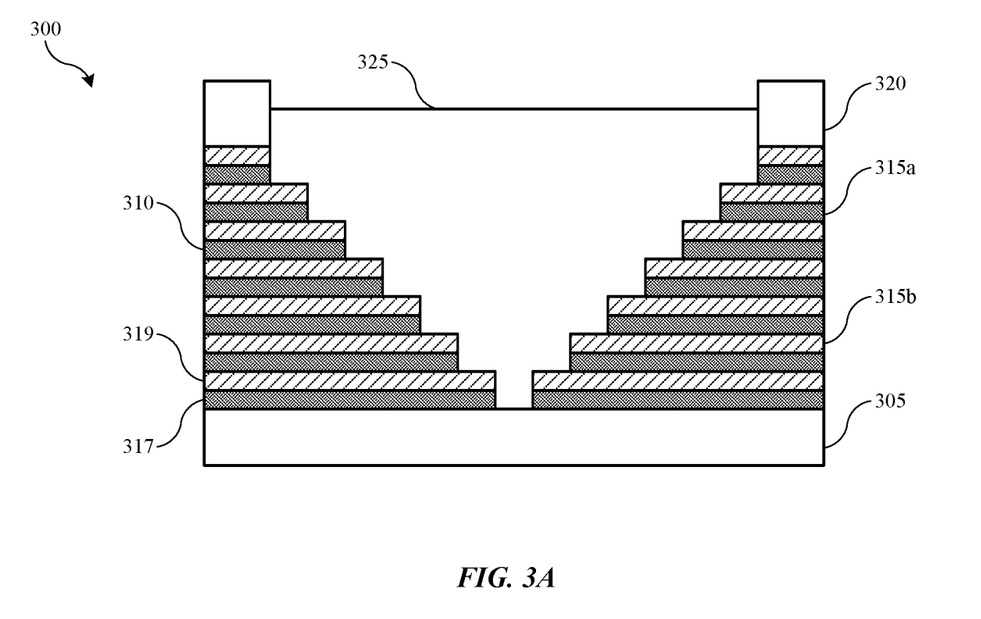
FIGS. 3A-3F illustrate schematic cross-sectional views of substrate materials on which selected operations are being performed according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structures on which a selective deposition material may be formed. As illustrated in FIG. 3A substrate 305 may have a number of layers of material deposited overlying the substrate. Substrate 305 may be any number of materials, such as a base wafer or substrate made of silicon or silicon-containing materials, germanium, other substrate materials, as well as one or more materials that may be formed overlying the substrate during semiconductor processing.

Structure 300 may illustrate a partial view of a stack of alternating layers of materials, which in some embodiments may be used in 3D NAND memory formation. The alternating layers of material may be produced by any number of methods, including plasma-enhanced chemical vapor deposition, physical vapor deposition, atomic layer deposition, thermally enhanced chemical vapor deposition, or any other formation technique. In some embodiments, plasma-enhanced chemical vapor deposition may be performed in a processing chamber, such as processing chamber 100 described previously. Although the remaining disclosure will discuss stacks of alternating layers of silicon oxide and silicon nitride, embodiments of the present technology may use different combinations of materials, such as silicon oxide and silicon, silicon nitride and silicon, silicon and doped silicon, or any number of other materials. Although method 200 will discuss formation of silicon oxide followed by formation of silicon nitride, the formation order may be reversed in embodiments similarly encompassed by the present technology. Additionally, any number of layers of material may be produced in a stack, or any portion of any stack, and different portions of a stack may include more, less, or similar numbers of layers of any other portion of a stack according to embodiments of the present technology.

As illustrated in FIG. 3A, structure 300 includes a substrate 305 having a stack 310 of alternating layers of silicon oxide and silicon nitride. The illustrated stack 310 may include a number of portions 315, which may each include at least one layer of silicon oxide material 317, and at least one layer of silicon nitride material 319. Each portion may also include multiple pairs of layers including greater than or about 2 pairs, greater than or about 10 pairs, greater than or about 50 pairs, greater than or about 100 pairs, or more pairs of layers. Any specific number of pairs encompassed by any of these stated ranges is to be understood as if specifically stated here. Although two portions, 315*a* and 315*b* are illustrated, more or less portions may be included according to some embodiments of the present technology.

The formation process may include forming a staircase structure as illustrated, which may be used to make contact with the individual cells formed at each layer. A mask material 320 may be formed over any of the portions of the stack prior to forming contact apertures for accessing each layer pair. Structures according to the present technology may be characterized by any aspect ratios or the height-to-width ratio of the structure, although in some embodiments the materials may be characterized by larger aspect ratios, which may increase effects on aspects of the produced structure as described previously. For example, in some embodiments the aspect ratio of exemplary structures, such as the depth of a contact aperture relative to the cross-sectional diameter, may be greater than or about 10:1, greater than or about 20:1, greater than or about 30:1, greater than or about 40:1, greater than or about 50:1, or greater. These high aspect ratios may frustrate many conventional etching operations or produce or exacerbate any of the issues described previously.

Figure 3B:
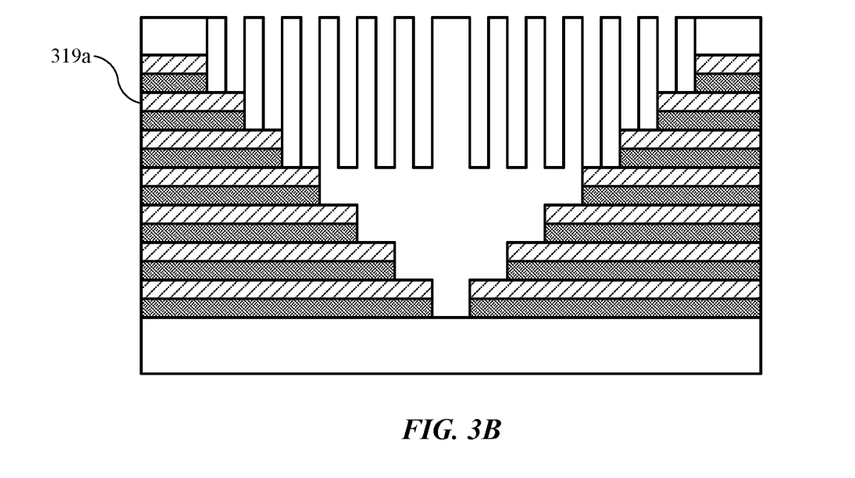

Once the layers have been formed, and a mask is deposited on the structure, a dielectric material 325 may be deposited to fill the staircase structure, and through which the contact apertures may be defined. Method 200 may include partially etching through the dielectric material 325 formed on the substrate at operation 205. The etch process may be any type of etching, and in some embodiments may be or include a reactive-ion etch process as discussed above. The etching may be performed to create contact apertures, which may provide separate access to each layered pair. Accordingly, each aperture or feature formed may be aligned with a specific tier in order to provide access to each layered pair. As illustrated in FIG. 3B, the initial etching operation may extend through the dielectric material at the first portion 315a of the stack, as well as at least partially extending through some of the dielectric material within the second portion 315b. As illustrated, at some depth through the stack the etching process into the dielectric material may be halted at operation 210, and this may occur prior to fully penetrating through the dielectric material. As illustrated in the figure, the etch process may form the contact apertures to access each layer pair, which may expose an upper region of the silicon nitride.

The depth of the initial etch process may depend on the number of layer pairs, characteristics of the materials being etched, or any other aspect that may influence whether a damage to the exposed materials may occur. For example, once silicon nitride material 319a is exposed, the material may continue to be contacted by plasma effluents while the etch process continues to expose the nitride at each underlying layer. As these stacks may have hundreds of layers or more, the time of exposure may be substantial. Consequently, even for etch processes having a fairly high selectivity to silicon oxide, silicon nitride may begin to etch due to the length of exposure to plasma effluents, which may fully etch through the silicon nitride material at the upper layers. Although the dielectric material may be silicon oxide, it is to be understood that any number of other fill materials may be used and etched to produce the contact apertures. Accordingly, prior to excessive damage or loss to overlying silicon nitride that has been exposed, the etching may be halted, which may occur at a depth of less than or about 75%, less than or about 50%, less than or about 25%, or less of a depth through the structure. The substrate may then be moved to a different chamber within a cluster tool, for example, which may allow vacuum to be maintained, although in some embodiments the substrate may be transferred between tools before forming a protective layer.

Figure 3C:
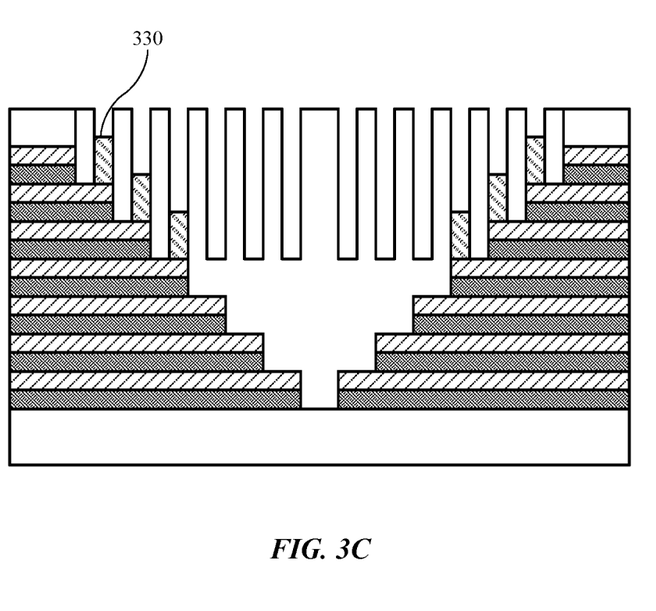

Method 200 may include forming a carbon-containing material selectively on the exposed materials for each layer pair on the substrate. In some embodiments the formation may be a conformal or a gapfill type of deposition, although in either case the deposition may selectively form on silicon nitride, while not forming on silicon oxide, for example. This may allow the deposition to occur only on the exposed regions of each layer pair, while not forming in the partially etched central portions that will be further etched. The deposition may be a molecular layer deposition, which, unlike self-assembled monolayers that may be limited in carbon chains, may provide protective coverage of several nanometers or more, which may facilitate increased protection, as well as resistance to plasma exposure during subsequent etching. As illustrated in FIG. 3C, the protective layer 330 of carbon-containing material may be conformally or gapfill formed within the etched feature, and may grow on the silicon nitride at each exposed layer. Forming the protective layer may include a sequential process of molecular layer deposition. For example, a first molecular species may be provided to the substrate at operation 215. The first molecular species may selectively couple with the silicon nitride at the exposed layers of material within the stack, and which may form fully across the aperture to protect the silicon nitride. After sufficient exposure to the first molecular species, a purge operation may be performed. At operation 220, a second molecular species may be provided, and which may selectively couple with the first molecular species.

Figure 3D:
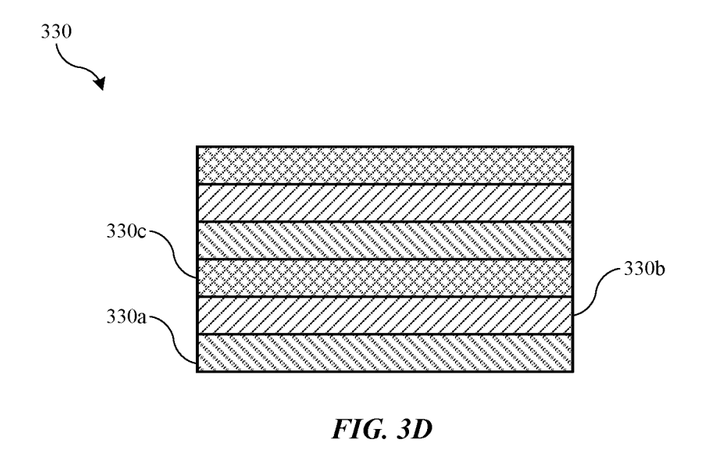

As illustrated in FIG. 3D, the molecular layers may be formed to couple together and form a film of material. The first molecular species may be characterized by a head group that adsorbs or otherwise couples with silicon nitride specifically at deposition conditions, and which may not couple with silicon oxide or whatever material may be dielectric material 330. This may produce a first molecular layer 330a overlying the structure only at the exposed nitride regions. The second molecular species may couple specifically with the first molecular species, allowing a second molecular layer 330b to form overlying the first molecular layer 330a. The process then may be repeated for any number of cycles to produce a protective layer of sufficient thickness. For example, after the second molecular species is purged, the first molecular species may be provided again, which may couple with the second molecular species and form another first molecular layer. The processing region may then be purged, and the second molecular species may be provided to form another second molecular layer. Although four such layers are described, it is to be understood that any number of cycles may be performed, which may include dozens of layers or any number of layers in some embodiments.

Producing a protective layer of carbon-containing material that may sufficiently protect the previously etched materials may be challenged by the ability of the materials to withstand the plasma etching during a subsequent etching operation. Metal-containing materials may have improved integrity relative to the polymeric materials formed by molecular layer deposition, although metal-containing materials may be difficult to strip from the structure after subsequent etching, and which may then cause additional damage to later exposed portions of the structure. However, by incorporating one or more metal materials into the protective layer produced by molecular layer deposition, an improved resistance to plasma may be provided, while still affording facile removal of the protective layer once etching has been completed. Accordingly, in some embodiments of the present technology, a metal may be incorporated into the carbon-containing material.

For example, in some embodiments a metal species may be provided to the substrate at optional operation 225. The metal species may couple or bond with the carbon-containing materials previously deposited, and provide an increased etch resistance against reactive ion etching. As discussed above, the protective layer may initially include the first and second molecular species, which may allow easier removal than if a metal was initially coupled with the exposed structural surfaces. The metal species may be formed to any thickness as well, by alternating pulses of the metal-containing precursor with the other deposition precursors. This may include alternating pulses with an oxygen species at optional operation 230. In some embodiments the oxygen species may not be necessary where the underlying molecular layers include oxygen, which can allow incorporation of the metal species. However, for thicker metal-containing regions, a set of alternating pulses of the metal precursor and an oxygen-containing precursor may be provided to develop a metal portion of the protective layer to any thickness. Additionally, in some embodiments the metal-containing species may not be included, but the oxygen species may be alternated with the first molecular species or the second molecular species to increase an oxygen concentration within the material.

As shown in FIG. 3D, a metal containing layer 330c may be formed over one or more layers of the first molecular layer and/or second molecular layer. This may also be repeated to produce a thicker overall protective layer material, where the same or different number of layers are formed any additional number of times. For example, any number of cycles of either or both of the metal layer and the two molecular layers may be produced according to embodiments of the present technology. The metal material may be pulsed once between each or every several molecular layers to incorporate metal into the layers produced, or a thicker metal layer may be produced any number of times over one or more layers of the first and/or second molecular layers, which may at least partially laminate the underlying materials to provide protection during reactive etching. It is to be understood that any number of combinations or variations in the protective layer formation are encompassed by the present technology, which can be performed in any order, and with any number of cycles or any aspect. Although the operations are shown in a particular order, it is to be understood that any of operations 215 to 230 may be performed in any order any number of times.

Depending on the thickness desired, the cycle may be repeated greater than or about 2 times, and may be repeated greater than or about 5 times, greater than or about 10 times, greater than or about 25 times, greater than or about 50 times, greater than or about 100 times, or more. This may produce a carbon-containing layer grown up over the exposed silicon nitride material at each exposed tier of the structure. Unlike self-assembled monolayers, which may be produced only to a few dozen Angstrom or less, the carbon-containing material of some embodiments of the present technology may be formed to a thickness of greater than or about 1 nm, and may be formed to a thickness of greater than or about 5 nm, greater than or about 10 nm, greater than or about 15 nm, greater than or about 20 nm, greater than or about 50 nm, greater than or about 75 nm, greater than or about 100 nm, or more.

Figure 3E:
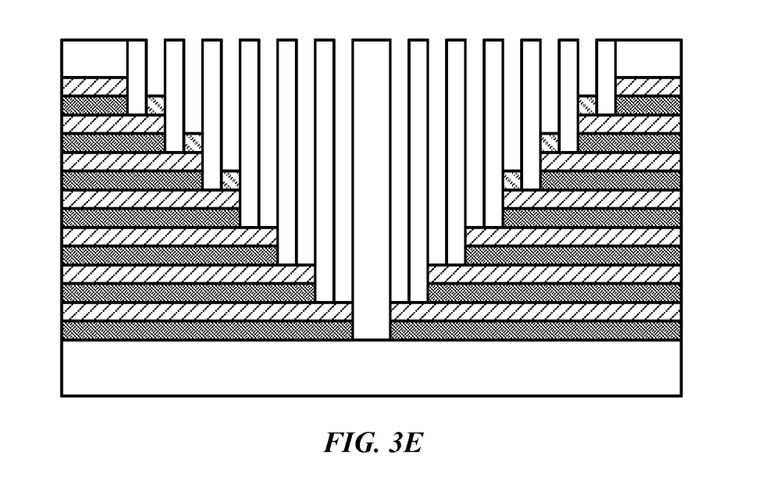

Once the layer of carbon-containing material has been formed on the overlying silicon nitride material previously exposed, method 200 may include a subsequent etch process. For example, if the substrate was moved in the previous operations, the substrate may be delivered back to the etch chamber, and the etch process may be resumed to etch the remaining portion of the dielectric material at operation 235, which may etch fully through the dielectric material at each contact aperture location to expose the nitride at each layer pair through the stack. As shown in FIG. 3E, the etch process may fully extend through the remaining portions of the dielectric material, and may at least partially etch through the protective layer produced on the upper layers. In some embodiments, the etch may fully remove the protective material 330 in one or more locations, although some portion may remain along portions of the silicon nitride at each layer as illustrated. Depending on the number of layers etched, in some embodiments a protective layer may be reformed after a second etch and proceeding a third etch, which may reform the material at the upper-most layers, and may also form the protective layer at mid-level layers that were exposed during the secondary etch. Any number of etch and protective layer formation sequences may be performed prior to exposing the substrate.

If carbon-containing material does remain after the etch process is completed, the remaining material may be removed at optional operation 240. The removal or stripping may be performed with limited damage to the stack of layers by utilizing characteristics of the molecular layer materials that may be in contact with the silicon nitride at each contact aperture. For example, an oxidant may be delivered to the processing region to react with the carbon-containing material and etch an amount sufficient to remove the carbon-containing material. The oxidation may be plasma enhanced, such as by providing an oxygen-containing precursor and forming a plasma to produce oxygen radical species, which may etch the carbon-containing material. Additionally, ozone or some other reactive material to remove carbon-containing material may be used, and which may not be plasma enhanced, to limit additional damage to the additionally exposed materials through the structure.

Figure 3F:
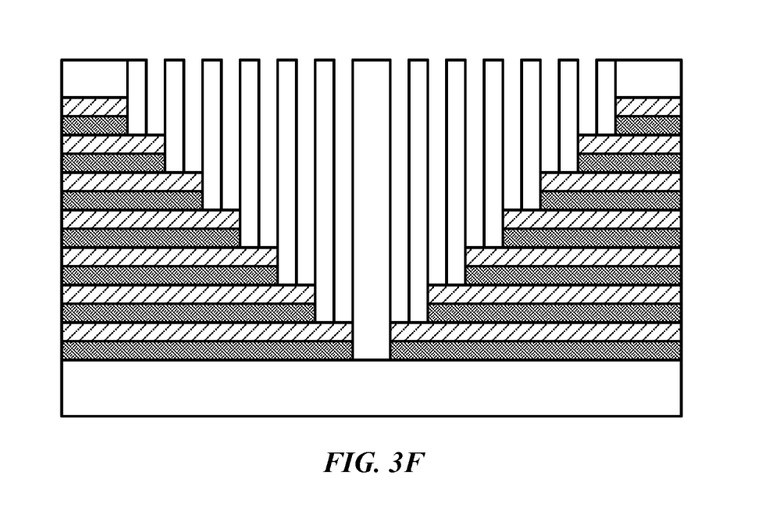

The removal process may also occur to strip the carbon-containing material with an anneal. While the carbon-containing materials may be more thermally stable than self-assembled monolayers of material, the materials may still decompose at sufficient temperature. Accordingly, in some embodiments the material may be exposed to an anneal of greater than or about 200° C., and may be exposed to an anneal of greater than or about 250° C., greater than or about 300° C., greater than or about 350° C., greater than or about 400° C., greater than or about 450° C., greater than or about 500° C., greater than or about 550° C., greater than or about 600° C., or more. By performing an anneal, exposed portions of silicon nitride at underlying layers may not be damaged by additional plasma species, or oxidized during the removal. As illustrated in FIG. 3F, once the carbon-containing material has been removed, the structure may provide contact access to each layered pair of material throughout the staircase structure.

The deposition temperature of the materials may impact the deposition on the exposed silicon nitride materials, as well as the extent of conformal coverage. For example, lower temperatures may increase residence time of the molecular deposition species, which may increase deposition on dielectric materials. Additionally, some materials may be more likely to flow during deposition, helping to fill the contact access at the exposed silicon nitride.

Accordingly, in some embodiments, forming the carbon-containing materials may include specific materials delivered at a substrate temperature of less than or about 200° C., and the process may be performed at a temperature of less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., less than or about 90° C., less than or about 80° C., less than or about 70° C., or less.

The formation of the carbon-containing layer may utilize molecular deposition species characterized by materials facilitating long chain production, and which may selectively couple with the metal-containing materials at formation temperatures. For example, the first molecular species may be characterized by a head group that may more readily couple or bond with the exposed metal-containing material during a reduced residence time by utilizing elevated temperatures that may limit interaction with the dielectric materials. To facilitate coupling with the metal-containing material, the first molecular precursor may include a head group or functional group such as an amine, including a primary amine moiety, a thiol, such as a sulfhydryl moiety, a carboxyl moiety, or a hydroxyl moiety. Additionally, the head group may include a bi-functional or poly-functional material, such as a diol, diamine, dithiol, or other poly-functional materials. Non-limiting examples of the first molecular species may include ethylene diamine, phenylenediamine, a plasma of nitrogen or a nitrogen-containing material, such as ammonia, tris(2-aminoethyl)amine, or any number of other materials including amine head or tail moieties.

The second molecular species may include one or more groups facilitating interaction with the head group of the first molecular species. For example, the second molecular species may be characterized by a functional group including oxygen, such as an acyl chloride, an aldehyde, an isocyanate, or any number of other oxygen-containing functional groups. Additionally, head groups of the second molecular species may include bi-functional or poly-functional groups, such as dialdehydes, diacylchlorides, dianhydrides, diisocyantos, or other poly-functional materials. Non-limiting examples of the second molecular species may include phenylene diisocyanate, terephthaloyl chloride, terephthalaldehyde, or any number of other oxygen-containing materials.

The molecular species utilized for the metal incorporation, when performed, may include any number of metals, such as aluminum, titanium, zinc, hafnium, zirconium, or any number of additional metals. Non-limiting examples of metal species may include trimethyl aluminum, titanium tetrachloride, di ethyl zinc, tetrakis(dimethylamino)hafnium, zirconium tert-butoxide, among any number of additional metal-containing materials. When an oxidizer is included, oxidizers may include water vapor, oxygen, ozone, ethylene glycol, or any number of other oxygen-containing materials. By producing protective layers with molecular layer deposition according to some embodiments of the present technology, improved formation of contact access may be afforded, which may limit effects such as over etching of silicon nitride at upper layers of the structure while access is still being formed for lower layers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   etching one or more features partially through a dielectric material to expose material from one or more layer pairs in a plurality of layer pairs formed on a substrate;
   halting the etching prior to penetrating fully through the dielectric material, and prior to exposing material from one or more remaining layer pairs in the plurality of layer pairs formed on the substrate;
   after halting the etching and exposing the material from the one or more layer pairs, and before exposing the material for the one or more remaining layer pairs, forming a layer of carbon-containing material on the exposed material from each of the one or more layer pairs having exposed material; and
   after forming the layer of carbon-containing material, etching the one or more features fully through the dielectric material to expose material for each of the one or more remaining layer pairs formed on the substrate.

2. The semiconductor processing method of claim 1, wherein forming the layer of carbon-containing material comprises one or more cycles of:
   providing a first molecular species that selectively couples with the exposed material formed on the substrate relative to the dielectric material, and
   providing a second molecular species that selectively couples with the first molecular species.

3. The semiconductor processing method of claim 2, wherein the first molecular species is characterized by a head group comprising an amine, diamine, diol, or dithiol.

4. The semiconductor processing method of claim 3, wherein the second molecular species comprises oxygen.

5. The semiconductor processing method of claim 2, wherein forming the layer of carbon-containing material further comprises:
   providing a metal-containing precursor to couple with either of the first molecular species or the second molecular species.

6. The semiconductor processing method of claim 5, wherein forming the layer of carbon-containing material further comprises:
   alternating delivery of an oxygen-containing material with either of the first molecular species or the second molecular species.

7. The semiconductor processing method of claim 5, wherein forming the layer of carbon-containing material comprises one or more additional cycles of:
   providing the first molecular species, and
   providing the second molecular species.

8. The semiconductor processing method of claim 1, wherein the layer of carbon-containing material is formed to a thickness of greater than or about 5 nm.

9. The semiconductor processing method of claim 1, wherein forming the layer of carbon-containing material is performed at a substrate temperature of less than or about 200° C.

10. The semiconductor processing method of claim 1, wherein the plurality of layer pairs comprises alternating layers of oxide and silicon nitride, and wherein the silicon nitride overlies the oxide in each layer pair.

11. The semiconductor processing method of claim 1, further comprising:
   removing the layer of carbon-containing material from the exposed material from each of the one or more layer pairs having exposed material formed on the substrate, wherein the removing comprises oxidizing the layer of carbon-containing material or performing a thermal anneal.

12. A semiconductor processing method comprising:
   etching one or more features partially through a dielectric material to expose silicon nitride from a first set of layer pairs formed on a substrate;
   halting the etching prior to penetrating fully through the dielectric material, and prior to exposing a second set of layer pairs formed on the substrate under the first set of layer pairs;
   after halting the etching and exposing the silicon nitride from the first set of layer pairs, and before exposing the second set of layer pairs, forming a layer of carbon-containing material on each region of silicon nitride exposed on the first set of layer pairs; and
   after forming the layer of carbon-containing material, etching the one or more features fully through the dielectric material to expose silicon nitride from the second set of layer pairs formed on the substrate.

13. The semiconductor processing method of claim 12, wherein forming the layer of carbon-containing material comprises one or more cycles of:
   providing a first molecular species that selectively couples with the silicon nitride from the first set of layer pairs, and
   providing a second molecular species that selectively couples with the first molecular species.

14. The semiconductor processing method of claim 13, wherein the first molecular species comprises an amine head group.

15. The semiconductor processing method of claim 12, wherein forming the layer of carbon-containing material is performed at a substrate temperature of less than or about 200° C.

16. The semiconductor processing method of claim 12, wherein the layer of carbon-containing material is formed to a thickness of greater than or about 10 nm.

17. The semiconductor processing method of claim 12, wherein the first set of layer pairs and the second set of layer pairs comprise alternating layers of oxide and silicon nitride, and wherein the silicon nitride overlies the oxide in each layer pair.

18. The semiconductor processing method of claim 12, further comprising:
   removing the layer of carbon-containing material from the region of silicon nitride exposed on the first set of layer pairs formed on the substrate.

19. A semiconductor processing method comprising:
   etching one or more features partially through a dielectric material to expose silicon nitride from a first set of layer pairs formed on a substrate, wherein the first set of layer pairs are formed in a staircase structure, and wherein each feature of the one or more features is aligned with a separate layer pair in the first set of layer pairs;
   halting the etching prior to penetrating fully through the dielectric material, and prior to exposing a second set of layer pairs formed on the substrate under the first set of layer pairs;
   after halting the etching and exposing the silicon nitride from the first set of layer pairs, and before exposing the second set of layer pairs, forming a layer of carbon-containing material on each region of silicon nitride exposed on the first set of layer pairs; and
   after forming the layer of carbon-containing material, etching the one or more features fully through the dielectric material to expose silicon nitride from the second set of layer pairs formed on the substrate.

20. The semiconductor processing method of claim 19, wherein forming the layer of carbon-containing material comprises one or more cycles of:
   providing a first molecular species that selectively couples with the silicon nitride from the first set of layer pairs, and
   providing a second molecular species that selectively couples with the first molecular species.

* * * * *